(12) United States Patent
Fattal et al.

(10) Patent No.: US 8,654,812 B2
(45) Date of Patent: Feb. 18, 2014

(54) Q-SWITCHED GRATING VERTICAL-CAVITY SURFACE-EMITTING LASER SYSTEM AND METHOD FOR FABRICATING THE SAME

(75) Inventors: David A. Fattal, Mountain View, CA (US); Michael Renne Ty Tan, Menlo Park, CA (US); Raymond G. Beausoleil, Redmond, WA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 337 days.

(21) Appl. No.: 13/013,609

(22) Filed: Jan. 25, 2011

(65) Prior Publication Data

US 2012/0189024 A1  Jul. 26, 2012

(51) Int. Cl.
 *H01S 5/183* (2006.01)
(52) U.S. Cl.
 USPC ........ 372/50.124; 372/10; 372/12; 372/50.11
(58) Field of Classification Search
 USPC .................................................... 372/50.124
 See application file for complete search history.

(56) References Cited

U.S. PATENT DOCUMENTS

| 6,088,376 | A |  | 7/2000 | O'Brien et al. |
| 2005/0194990 | A1 | * | 9/2005 | Gothoskar et al. ............ 324/765 |
| 2006/0239325 | A1 |  | 10/2006 | Johnson et al. |
| 2007/0153860 | A1 |  | 7/2007 | Chang-Hasnain et al. |
| 2012/0001166 | A1 | * | 1/2012 | Doany et al. ..................... 257/43 |

OTHER PUBLICATIONS

Chang-Hasnain et al., "High-Contrast Grating VCSELs", IEEE J. Sel. Topics Quantum Electron., vol. 15, No. 3, pp. 869-877, May 2009.*
Delgado-Pinar, et al.: "*Q-Switching of an All-Fiber Laser by Acousto-Optic Modulation of a Fiber Bragg Grating*" Optics Express, Feb. 6, 2006, vol. 14, No. 3, pp. 1106-1112.
Williams, et al.: "*All-Optical, Actively Q-Switched Fiber Laser*", Optics Express, Apr. 12, 2010, vol. 18, No. 8, pp. 7714-7723.

* cited by examiner

*Primary Examiner* — Xinning Niu

(57) ABSTRACT

A vertical cavity surface emitting laser (VCSEL) system and method of fabrication are included. The VCSEL system includes a gain region to amplify an optical signal in response to a data signal and a first mirror arranged as a partially-reflective high-contrast grating (HCG) mirror at an optical output of the VCSEL system. The VCSEL system also includes a second mirror. The first and second mirrors can be arranged as a laser cavity to resonate the optical signal. The VCSEL system further includes a doped semiconductor region to generate a current through the first mirror in response to a voltage signal to substantially alter the reflectivity of the first mirror to provide Q-switching capability of the VCSEL system.

20 Claims, 12 Drawing Sheets

Q-SWITCHED GRATING VERTICAL-CAVITY SURFACE-EMITTING LASER SYSTEM AND METHOD FOR FABRICATING THE SAME

BACKGROUND

A vertical-cavity surface-emitting laser (VCSEL) is a type of semiconductor laser diode with laser beam emission perpendicular from a top surface. VCSELs differ from other types of edge-emitting semiconductor lasers that emit laser beams from surfaces formed by cleaving an individual chip out of a wafer. The perpendicular emission of the laser from a VCSEL allows a VCSEL to be tested at various stages throughout the fabrication process to check for material quality and processing issues, unlike edge-emitting lasers that cannot be tested until the end of a production process. However, like with edge-emitting lasers, dynamic laser applications that incorporate typical VCSELs can require additional optical devices based on the invariability of manufactured VCSELs.

DETAILED DESCRIPTION

Figure 1:
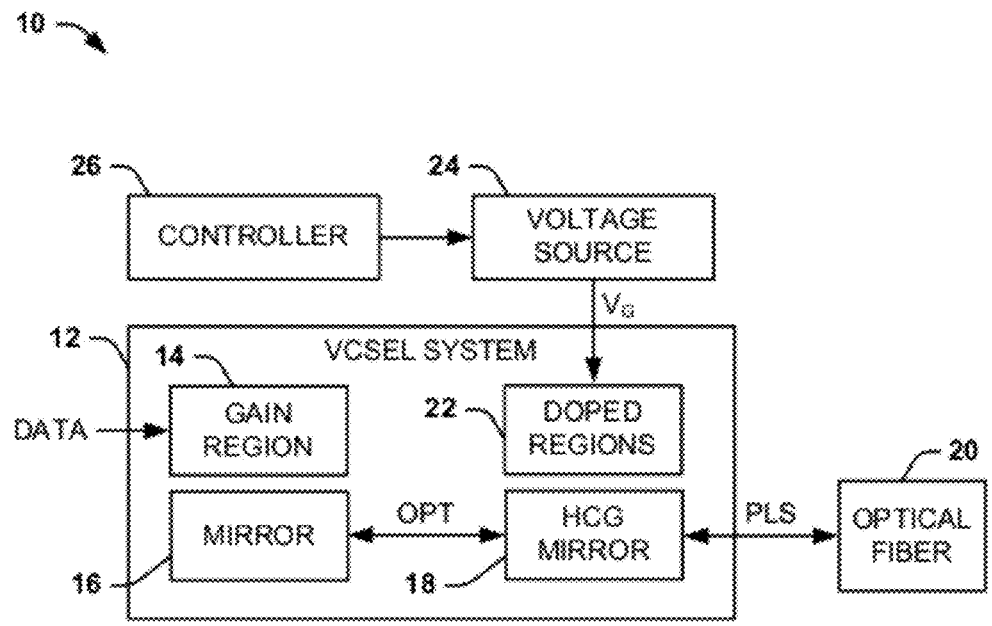
FIG. 1 illustrates an example of a VCSEL system.

FIG. 1 illustrates an example of a laser system 10. The laser system 10 can be implemented in any of a variety of optical applications, such as non-linear optical and lasing band formation applications. The laser system 10 includes a vertical-cavity surface-emitting laser (VCSEL) 12. In the example of FIG. 1, the VCSEL 12 includes a gain region 14 that is configured to generate an optical signal (OPT) in response to a signal (DATA). As an example, the signal (DATA) could be an RF baseband data signal. The VCSEL 12 also includes a mirror 16. As an example, the mirror 16 can be configured as a multi-layer n-doped distributed Bragg reflector (n-DBR).

The VCSEL 12 further includes a high-contrast grating (HCG) mirror 18. The HCG mirror 18 can be configured as a partially-reflective mirror (e.g., approximately 99.95% reflective), such that the mirror 16 and the HCG mirror 18 can cooperate to form a laser cavity to resonate the optical signal (OPT). Thus, a portion of the optical signal (OPT) can be emitted from the laser cavity and launched into an optical fiber 20 as an optical signal (PLS). For example, the optical fiber 20 can be substantially aligned with the HCG mirror 18 based on the fabrication of the VCSEL 12, as described herein. As an example, the optical fiber 20 can be a single-mode fiber.

In addition, the VCSEL 12 is demonstrated as including doped regions 22 that can be fabricated on opposing sides of the HCG mirror 18. As an example, the doped regions 22 can include an n-doped region and a p-doped region that are arranged on the opposing sides of the HCG mirror 18. The doped regions 22 can be configured to generate a current through the HCG mirror 18 to substantially reduce the reflectivity of the HCG mirror 18 (e.g., down to approximately 90%), such as in response to a voltage signal $V_Q$ generated from a voltage source 24. As a result, a controller 26 can control the voltage source 24 to generate the voltage signal $V_Q$ to manipulate the reflectivity of the HCG mirror 18, such as to provide Q-switching capability of the VCSEL 12. As a result, the VCSEL 12 can be configured to generate the optical signal (PLS) as high-power laser pulses in response to changes in the reflectivity of the HCG mirror 18 via the controller 26 and the voltage source 24.

Figure 2:
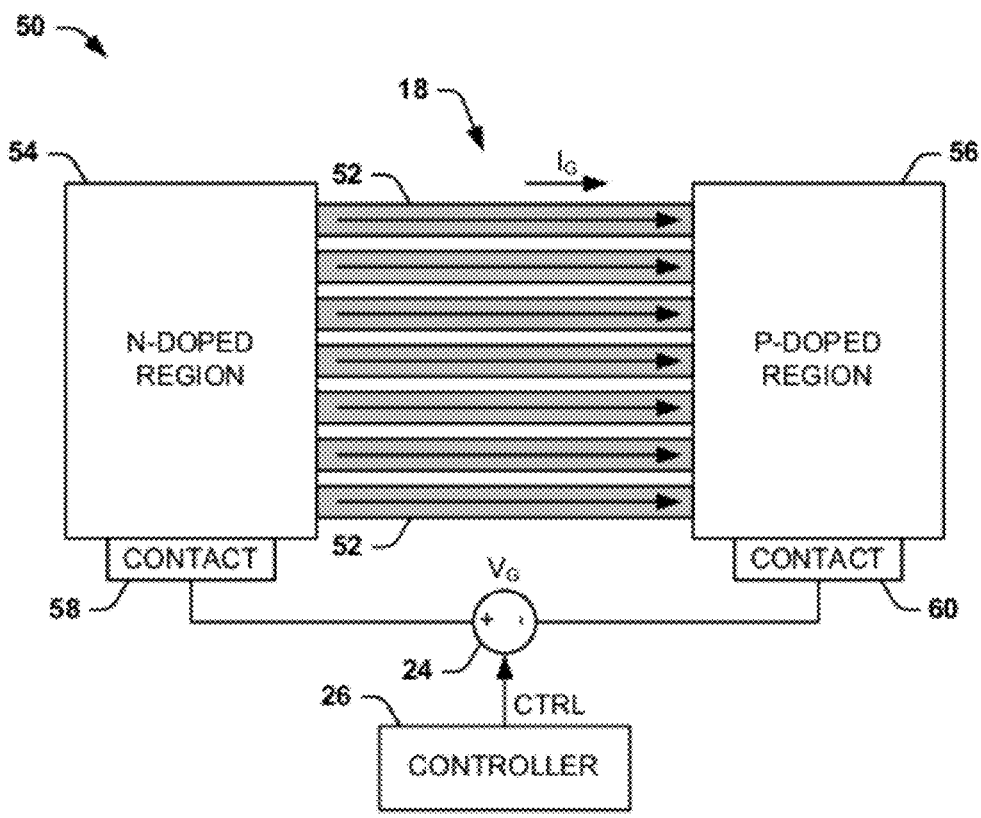
FIG. 2 illustrates an example diagram of Q-switching of a VCSEL system.

FIG. 2 illustrates an example diagram 50 of Q-switching of the VCSEL system 10. In the example of FIG. 2, reference is to be made to the example of FIG. 1. The diagram 50 demonstrates the HCG mirror 18 arranged as a plurality of fingers 52 that interconnect a first doped region 54 and a second doped region 56. In the example of FIG. 2, the first doped region 54 is configured as an n-doped region and the second doped region 56 is configured as a p-doped region. As an example, the first and second doped regions 54 and 56 can be configured as doped silicon, or can be configured as including any of a variety of other semiconductor materials. As another example, the HCG mirror 18 can be configured as intrinsic silicon.

The diagram 50 also includes the controller 26 and the voltage source 24. In the example of FIG. 2, the controller 26 generates a control signal CTRL that can activate and deactivate the voltage source 24 to generate the voltage signal $V_Q$. As demonstrated in the example of FIG. 2, the positive polarity of the voltage signal $V_Q$ is provided to a first electrical contact 58 that is electrically coupled to the first doped region 54 and the negative polarity of the voltage signal (e.g., neutral or common) is provided to a second contact 60 that is electrically coupled to the second doped region 56. Thus, in response to the voltage source 24 being activated by the controller 26, the voltage signal $V_Q$ can generate a current $I_Q$ from the first doped region 54 to the second doped region 56 through the HCG mirror 18. The current $I_Q$ can thus inject minority carriers into the fingers 52 of the HCG mirror 18 to alter the reflectivity of the HCG mirror 18. As an example, the reflectivity can be reduced from about 99.95% to about 90%, depending on the magnitude of the current $I_Q$, such that the HCG mirror 18 can experience substantial absorption in response to larger magnitudes of the current $I_Q$.

Based on the action of the controller 26 in activating and deactivating the voltage source 24, the Q-switching demonstrated by the diagram 50 can be implemented to generate the pulses of the optical signal (PLS). For example, as described above, the controller 26 can activate the voltage source 24 to generate the voltage signal $V_Q$, thus generating the current $I_Q$ to reduce the reflectivity of the HCG mirror 18. As a result, the resonating optical signal (OPT) can be released as a high peak-energy optical signal pulse (PLS). The controller 26 can then deactivate the voltage source 24 to cease the flow of the current $I_Q$ through the HCG mirror 18. As a result, the mirror quality of the HCG mirror 18 can be rapidly restored to allow more of the optical signal (OPT) to resonate within the VCSEL 12, thus increasing the power of the optical signal (OPT). Accordingly, the optical signal (OPT) can be very quickly pulsed, such as in the picosecond to nanosecond range of time.

Figure 3:
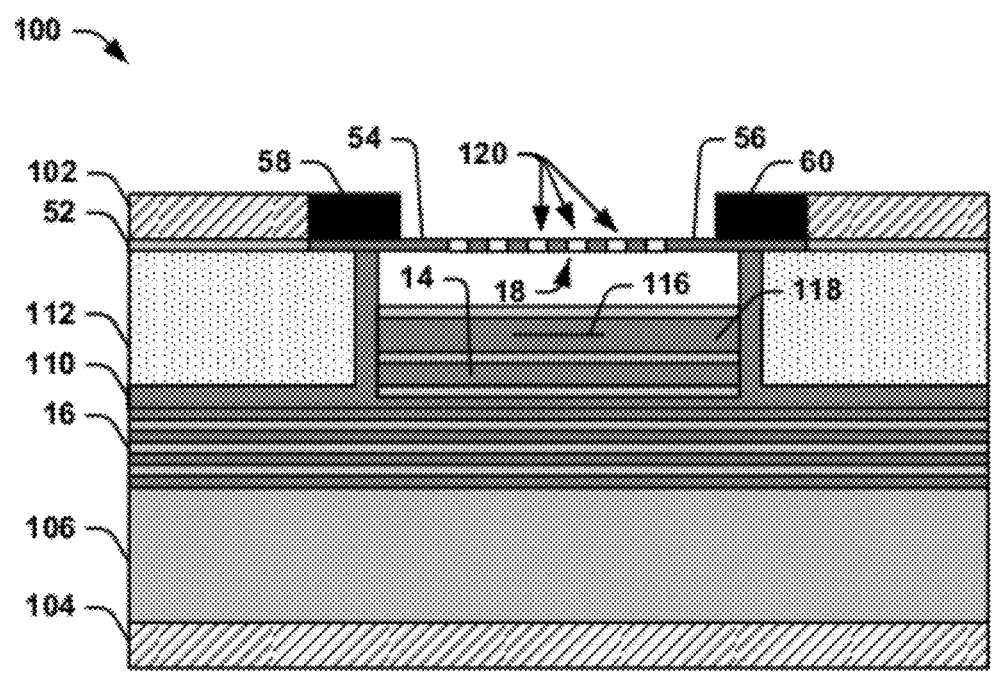
FIG. 3 illustrates an example of a cross-sectional view of a VCSEL system.

FIG. 3 illustrates an example of a cross-sectional view of a VCSEL system 100. The VCSEL system 100 can correspond to the VCSEL system 10 in the example of FIG. 1. Therefore, reference is to be made to the example of FIGS. 1 and 2 in the following description of the example of FIG. 3.

The VCSEL system 100 includes a p-contact region 102 and an n-contact region 104 that act as contacts of a diode through which the signal (DATA) passes to generate the optical signal (OPT). The n-contact region 104 is covered by a substrate layer 106. As an example, the substrate layer 106 can be an N-doped gallium arsenide (GaAs) layer. The VCSEL system 100 also includes the mirror 16, demonstrated in the example of FIG. 3 as a multi-layer n-doped DBR that acts as an approximately 100% reflective mirror.

The VCSEL system 100 also includes a silicon nitride (SiN) passivation layer 110 and a polyimide 112 that substantially surround the gain region 14. As an example, the gain region 14 can be a GaAs multiple quantum well (MQW) through which the signal (DATA) generates the optical signal (OPT). The optical signal (OPT) is thus generated at the gain region 14 and reflected from the n-doped DBR 108 to be emitted from an aperture 116 in an oxide layer 118. The VCSEL system 100 also includes an etched pattern 120 that can form the HCG mirror 18. The etched pattern 120 can include sub-wavelength etchings in a silicon layer 122, such as fingers, holes, grooves, and/or posts, such that the HCG mirror 18 can be partially-reflective (e.g., 99.95%). Therefore, the n-doped DBR 108 and the HCG mirror 18 cooperate to act as a laser cavity to resonate the optical signal (OPT).

The silicon layer 122 also includes the first doped region 54 and the second doped region 56. Similar to as demonstrated in the example of FIG. 2, the first doped region 54 can be an n-doped region and the second doped region 56 can be a p-doped region. The VCSEL system 100 also includes electrical contacts 58 and 60 that are coupled to the respective first and second doped regions 54 and 56. The electrical contacts 58 and 60 can thus receive the voltage signal $V_Q$ generated from the voltage source 24 (not shown in the example of FIG. 3). Therefore, the electrical coupling of the electrical contacts 58 and 60 with the respective first and second doped regions 54 and 56 can allow a current to be generated through the HCG mirror 18 in response to the voltage signal $V_Q$. As a result, the reflectivity of the HCG mirror 18 can be substantially reduced to provide Q-switching of the VCSEL system 100, such as to generate the pulsed optical signal (PLS).

Figure 4:
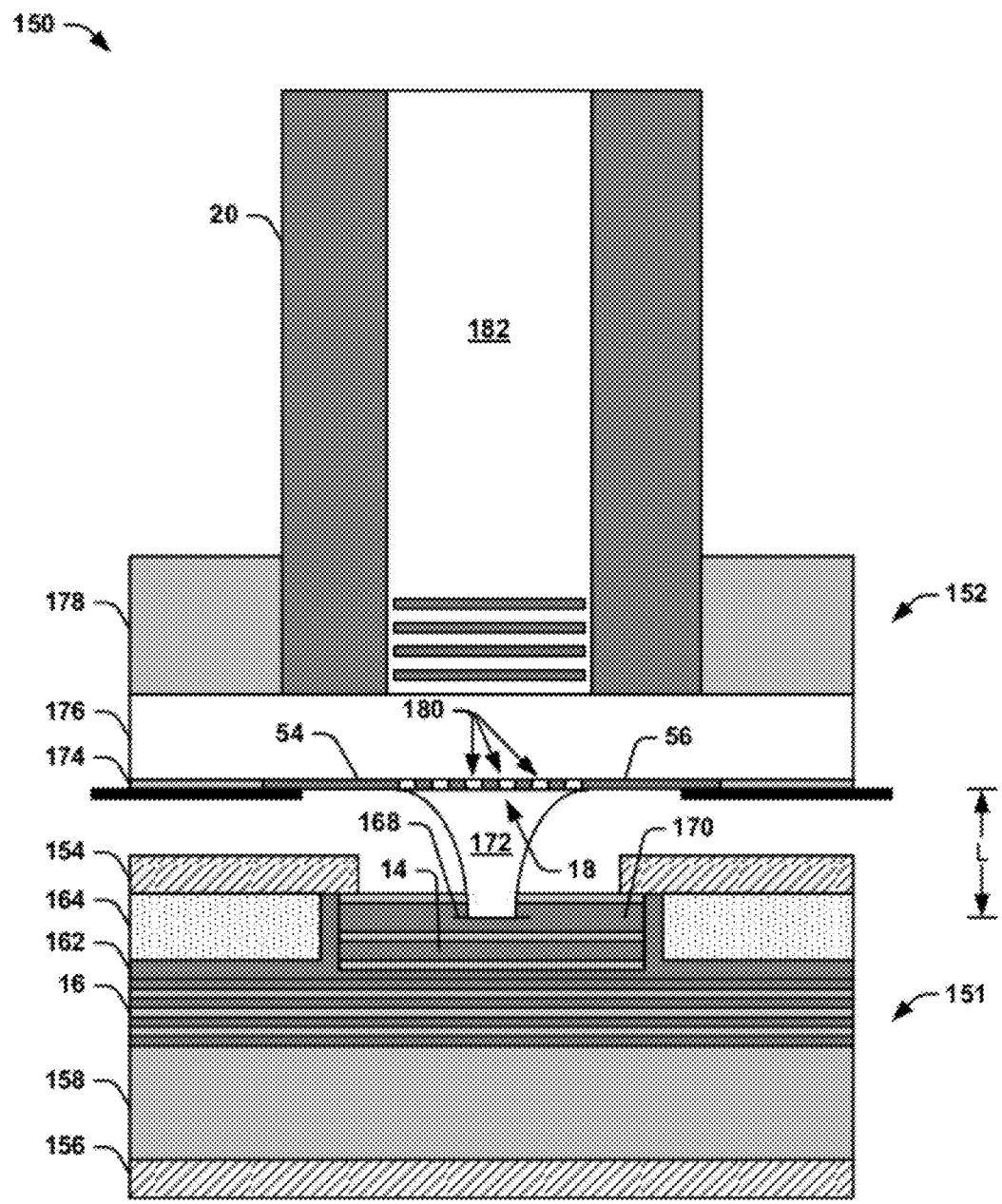
FIG. 4 illustrates another example of a cross-sectional view of a VCSEL system.

FIG. 4 illustrates an example of a cross-sectional view of a VCSEL system 150. Similar to the VCSEL system 100 in the example of FIG. 3, the VCSEL system 150 can also correspond to the VCSEL system 10 in the example of FIG. 1. Therefore, reference is to be made to the example of FIGS. 1 and 2 in the following description of the example of FIG. 4.

The VCSEL system 150 demonstrates a first portion 151 and a second portion 152 of the VCSEL system 150. The first portion 151 includes a p-contact region 154 and an n-contact region 156 that act as contacts of a diode through which the signal (DATA) passes to generate the optical signal (OPT). The n-contact region 156 is covered by a substrate layer 158. As an example, the substrate layer 158 can be an N-doped GaAs layer. The first portion 151 also includes the mirror 16, demonstrated in the example of FIG. 4 as a multi-layer n-doped DBR that acts as an approximately 100% reflective mirror.

The first portion 151 also includes a SiN passivation layer 162 and a polyimide 164 that substantially surround the gain region 14, which could be configured as a GaAs MQW to generate the optical signal (OPT). The optical signal (OPT) is thus generated at the gain region 14 and reflected from the mirror 16 to be emitted from an aperture 168 in an oxide layer 170. In the example of FIG. 4, the optical signal (OPT) is shown at 172. The first portion 151 can be coupled to the second portion 152 by a supporting structure (not shown), such as the supporting structure 30 in the example of FIG. 1, to suspend the second portion 152 over the first portion 151 by a predetermined amount.

As described in greater detail below, the second portion 152 can be fabricated from a silicon-on-insulator (SOI) structure. Specifically, the second portion 152 includes a first silicon layer 174, an insulator layer 176 overlying the first silicon layer 174, and a second silicon layer 178 overlying the insulator layer 176. The first silicon layer 174 can be separated from the aperture 168 by a distance L that can be adjusted based on an associated supporting structure (not shown) to tune the lasing wavelength of the optical signal (OPT). The first silicon layer 174 can include an etched pattern 180 that can form the HCG mirror 18. The etched pattern 180 can include sub-wavelength etchings into the first silicon layer 174, such as fingers, holes, grooves, and/or posts, such that the HCG mirror 18 can be partially-reflective (e.g., 99.95%). Therefore, the mirror 16 and the HCG mirror 18 cooperate to act as a laser cavity to resonate the optical signal (OPT). In addition, the HCG mirror 18 can be patterned in a manner to control the shape of the optical signal (OPT) to simulate a curved mirror, such that the optical signal (OPT) is focused into the aperture 168 upon being reflected from the HCG mirror 18. Furthermore, the patterning of the HCG mirror 18 can tune the lasing wavelength of the optical signal (OPT).

The insulator layer 176 can be a glass layer such as $SiO_2$. Thus, the insulator layer 176 can be selected to have approximately 0% reflectivity. The insulator layer 176 separates the first silicon layer 174 from the second silicon layer 178. The second silicon layer 178 can be fabricated to have a hole etched down to the insulator layer 176, with the hole being etched at approximately the same location as the HCG mirror 18 on the opposite surface of the insulator layer 176. Thus, the optical fiber 20 can be received in the hole in the second silicon layer 178. The hole in the second silicon layer 178 can be etched to have an inside diameter (ID) that is approximately equal to an outside diameter (OD) of the optical fiber 20, such that the core of the optical fiber 20 can be substantially aligned with the HCG mirror 18.

As an example, the first and second portions 151 and 152 can be fabricated from separate semiconductor wafers. For example, the first portion 151 can merely be fabricated as a VCSEL without an associated second mirror (e.g., the HCG mirror 18). However, the second portion 152 can be fabricated from a separate SOI wafer, such as including the two layers of silicon 174 and 178 separated by the insulator layer 176 (e.g., $SiO_2$). Therefore, because the first and second portions 151 and 152 are fabricated from separate wafers, the first and second portions 151 and 152 can be arranged as separate and independent pieces. Thus, the VCSEL system 150 can include a supporting structure (not shown) that is configured to couple the first and second portions 151 and 152 such that the HCG mirror 18 can be substantially aligned with the mirror 16 to form the laser cavity. As an example the associated supporting structure can include a non-etched portion of the wafer from which the first portion 151 is fabricated, such as bonded to both the first and second portions 151 and 152. Thus, the supporting structure can be easily adjusted, such that the lasing wavelength of the optical signal (OPT) can be easily tuned based on a length of the laser cavity. Accordingly, the VCSEL 12 can provide advantages over a typical monolithic VCSEL system, such as the VCSEL system 100 in the example of FIG. 3.

The first silicon layer 174 also includes the first doped region 54 and the second doped region 56. As an example, the first doped region 54 can be an n-doped region and the second doped region 56 can be a p-doped region. The second portion 152 also includes the electrical contacts 58 and 60 that are coupled to the respective first and second doped regions 54 and 56. The electrical contacts 58 and 60 can thus receive the voltage signal $V_Q$ generated from the voltage source 24 (not shown in the example of FIG. 4). Therefore, the electrical coupling of the electrical contacts 58 and 60 with the respective first and second doped regions 54 and 56 can allow a current to be generated through the HCG mirror 18 in response to the voltage signal $V_Q$. As a result, the reflectivity of the HCG mirror 18 can be substantially reduced to provide Q-switching of the VCSEL system 50, such as to generate the pulsed optical signal (PLS). As a result, the energy of the pulsed optical signal (PLS) generated via the Q-switching in response to generating the current through the HCG mirror 18 can pass through the HCG mirror 18 to be launched directly into the optical fiber 20.

As an example, the optical fiber 20 can include a single mode core 182, such that the optical fiber 20 can be a single mode fiber. Thus, because the single mode core 182 of the optical signal 22 can be substantially aligned with the HCG mirror 18, the pulsed optical signal (PLS) can be coupled into the optical fiber 20 to provide a much more precise output mode of the pulsed optical signal (PLS) when launched into the optical fiber 20. In addition, as demonstrated in the example of FIG. 4, the HCG mirror 18 is fabricated such that it is a layer that is coupled to the insulator layer 176, as opposed to being suspended over the aperture 168 via being coupled to the p-contact 102 in the example of FIG. 3. Therefore, the laser cavity formed by the mirror 16 and the HCG mirror 18 can experience much greater spatial stability than in the VCSEL system 100 in the example of FIG. 3.

Fabrication of the VCSEL system 150 will now be described. In the following description of the examples of FIGS. 5-22, reference is to be made and like reference numbers are made to the example of FIG. 4.

Figure 5:
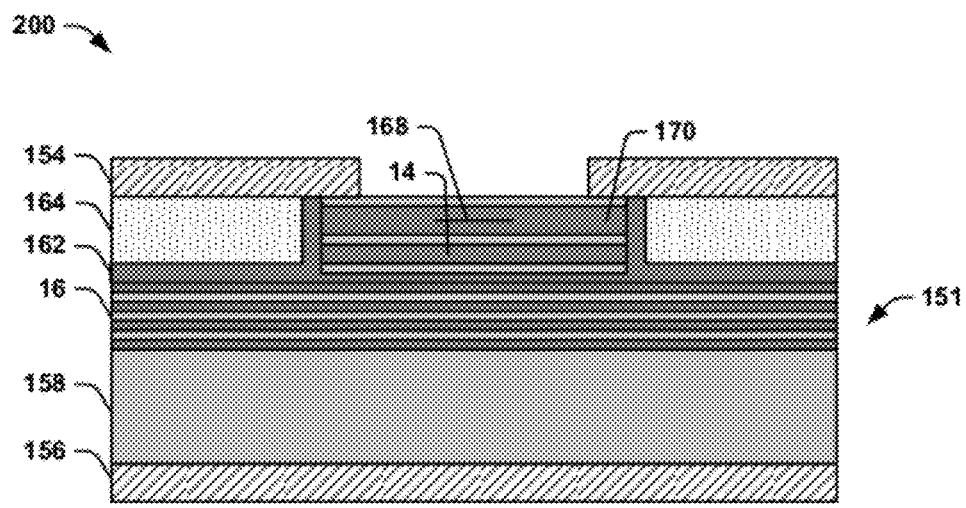
FIG. 5 illustrates an example of a first portion of the VCSEL system of FIG. 4.

FIG. 5 illustrates an example diagram 200 of the first portion 151 of the VCSEL system 150 of FIG. 4. The first portion 151 can be fabricated in a variety of manners to include the p-contact region and n-contact region 154 and 156, the substrate layer 158, and the mirror 16. In addition, the first portion 100 can be fabricated to include the SiN passivation layer 162, the polyimide 164, and the gain region 14. Therefore, the first portion 151 can be fabricated such that the first portion 151 is grown as a high-speed oxide-confined VCSEL portion, such that the first portion 151 includes a gain region (e.g., the MQW 166) to generate the optical signal (OPT) and the mirror 16 to act as part of a laser cavity to resonate the optical signal (OPT).

Figure 6:
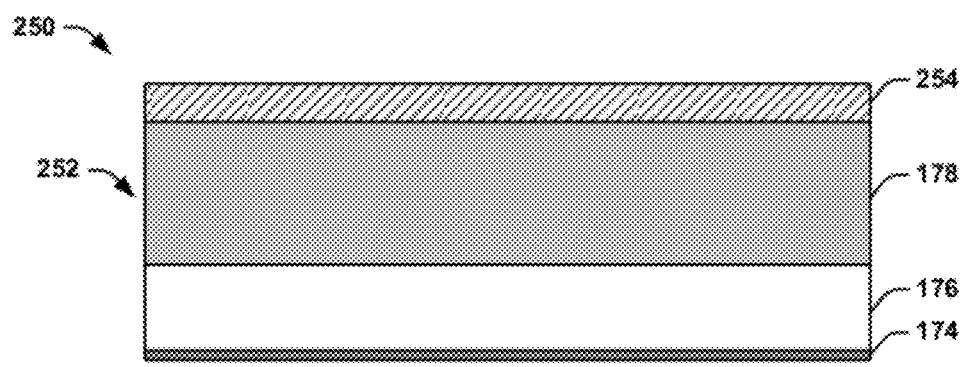
FIG. 6 illustrates an example diagram of a cross-sectional view of an SOI structure including a photoresist layer.

FIG. 6 illustrates an example of a cross-sectional view diagram 250 of an SOI structure 252 including a photoresist layer 254. The SOI structure 252 is demonstrated in the example of FIG. 5 as a portion of an inverted SOI wafer that includes the first silicon layer 174, the insulator layer 176, and the second silicon layer 178, which can act as a substrate during fabrication of the SOI structure 252. As an example, the SOI structure 252 can be formed via a Separation by Implantation of Oxygen (SIMOX) process. The basic steps of the SIMOX process can include implanting oxygen beneath the surface of a silicon wafer. A high temperature annealing step can next be performed to coalesce the implanted oxygen atoms into a uniform layer of $SiO_2$. The annealing step can typically be performed at temperatures greater than 1250° C. for several hours to coalesce the implanted oxygen and achieve solid state recrystallization of the second silicon layer 178 from the surface downward. Thus, as an example, the second silicon layer 178 can be grown to have a thickness of approximately 500 μm.

The SOI structure 252 is also illustrated as including the photoresist layer 254 formed on the second silicon layer 178. The photoresist layer 254 can have a thickness of about 500 Å-5000 Å. However, it is to be appreciated that the thickness thereof may be of any dimension suitable for fabricating the second portion 152. Accordingly, the thickness of the photoresist layer 254 can vary in correspondence with the wavelength of radiation used to pattern the photoresist layer 254. The photoresist layer 254 may be formed over the second silicon layer 178 via conventional spin-coating or spin casting deposition techniques.

Figure 7:
FIG. 7 illustrates an example diagram of the SOI structure of FIG. 6 with the photoresist layer having been patterned.

FIG. 7 illustrates an example diagram 300 of the SOI structure 252 of FIG. 6 with the photoresist layer 254 having been patterned. Specifically, photoresist layer 254 is patterned using conventional techniques to form a hole having an ID that is approximately equal to the OD of the optical fiber 20. As an example, the hole ID can be approximately 125 μm. The patterned photoresist layer 254 can thus serve as an etch mask layer for processing or etching the underlying second silicon layer 178.

Figure 8:
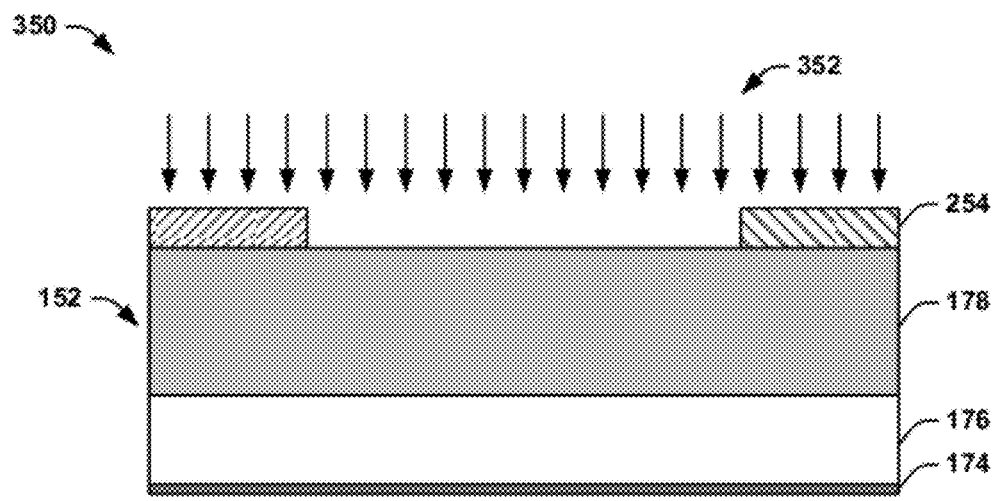
FIG. 8 illustrates an example diagram of the SOI structure of FIG. 7 undergoing an etching step.

FIG. 8 illustrates an example diagram 350 of the SOI structure 252 of FIG. 7 undergoing an etching step. The etch can be an anisotropic deep reactive ion etching (DRIE), as indicated by the arrows 352. Any suitable DRIE etch technique may be used to etch the second silicon layer 178. For example, the second silicon layer 178 can be anisotropically etched with one or more plasma gases, such as carbon tetrafloride ($CF_4$) containing fluorine ions, in a commercially available etcher, such as a parallel plate DRIE apparatus or, alternatively, an electron cyclotron resonance (ECR) plasma reactor to replicate the mask pattern of the patterned photoresist layer 254.

Figure 9:
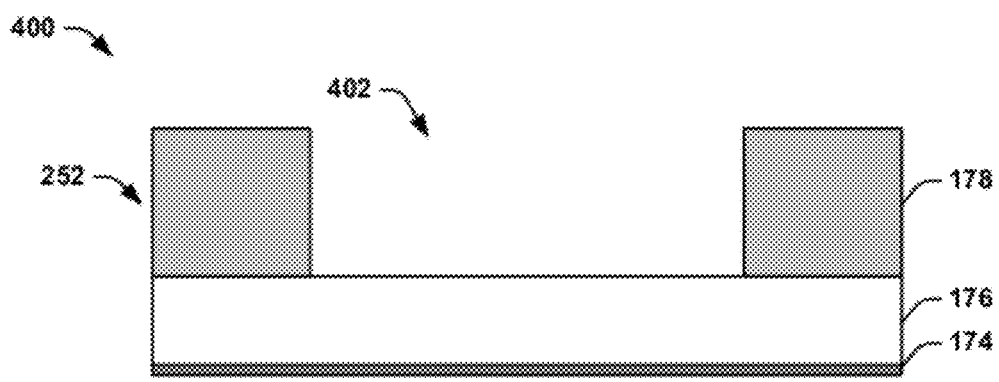
FIG. 9 illustrates an example diagram of the SOI structure of FIG. 8 after the etching step is substantially complete.
Figure 10:
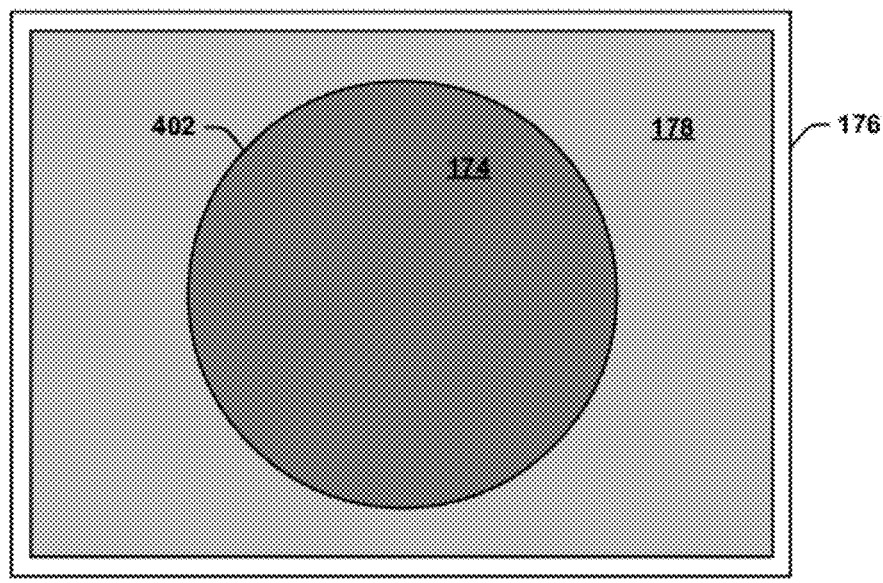
FIG. 10 illustrates an example diagram of a top view of the SOI structure of FIG. 9.

FIG. 9 illustrates an example diagram 400 of the SOI structure 252 of FIG. 8 after the etching step is substantially complete. Specifically, the diagram 400 illustrates a partially complete SOI structure 252 after a stripping step (e.g., ashing in an $O_2$ plasma) is substantially complete to remove remaining portions of the patterned photoresist layer 254. Therefore, the SOI structure 252 includes a hole 402 that has been etched via the DRIE etch process of the example of FIG. 8 in the second silicon layer 178. The DRIE etch process is thus demonstrated in the example of FIG. 9 as having etched the second silicon layer 178 completely down to the insulator layer 176, such that the hole can have a depth of approximately 500 μm. FIG. 10 illustrates an example diagram 450 of a top view of the SOI structure 252 of FIG. 9. In the example of FIG. 10, the hole 402 is demonstrated as having a substantially round dimension. However, it is to be understood that the hole 402 could have a variety of types of dimensions, such as being rectangular, oval, or irregular.

Figure 11:
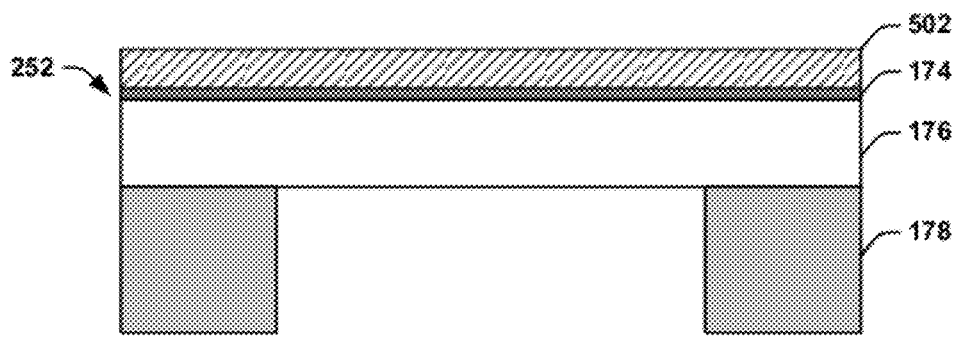
FIG. 11 illustrates an example diagram of a cross-sectional view of the SOI structure of FIG. 9 with a photoresist layer.

FIG. 11 illustrates an example diagram 500 of a cross-sectional view of the SOI structure 252 of FIG. 9 with a photoresist layer 502. In the example of FIG. 11, the SOI structure 252 is demonstrated as having been inverted, such as that the SOI structure 252 is demonstrated as upside-down relative to as demonstrated in the examples of FIGS. 6-9, and thus oriented the same as a typical SOI wafer. The SOI structure 252 thus still includes the first silicon layer 174, the insulator layer 176, and the second silicon layer 178. The SOI structure 252 is also illustrated as including the photoresist layer 502 formed on the first silicon layer 174. The photoresist layer 502 can have a thickness suitable for fabricating the second portion 152 (e.g., about 500 Å-5000 Å), such as based on the wavelength of radiation used to pattern the photoresist layer 502. The photoresist layer 502 may be formed over the first silicon layer 174 via conventional spin-coating or spin casting deposition techniques.

Figure 12:
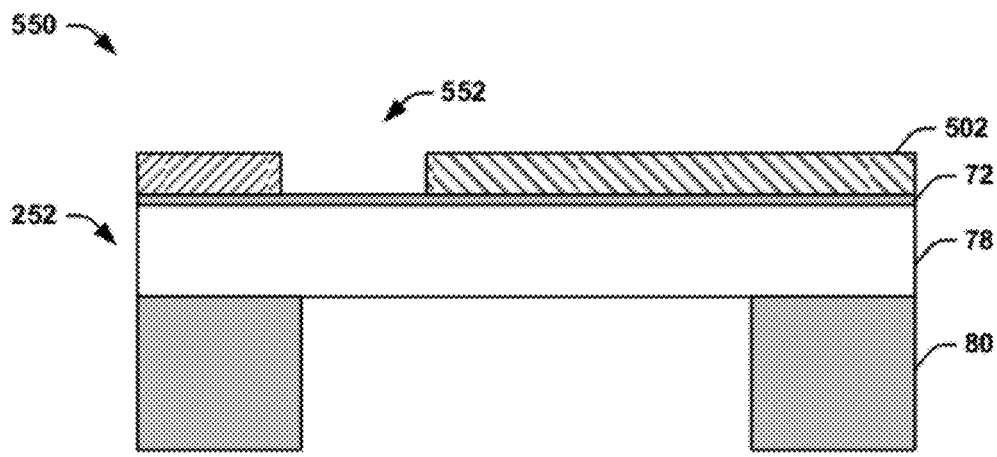
FIG. 12 illustrates an example diagram of the SOI structure of FIG. 11 with the photoresist layer having been patterned.

FIG. 12 illustrates an example diagram 550 of the SOI structure 252 of FIG. 11 with the photoresist layer 502 having been patterned. Specifically, photoresist layer 502 is patterned using conventional techniques to form a region 552 that is approximately the size of the first doped region 54 on the first silicon layer 174. The patterned photoresist layer 502 can thus serve as a mask layer for doping the underlying first silicon layer 174.

Figure 13:
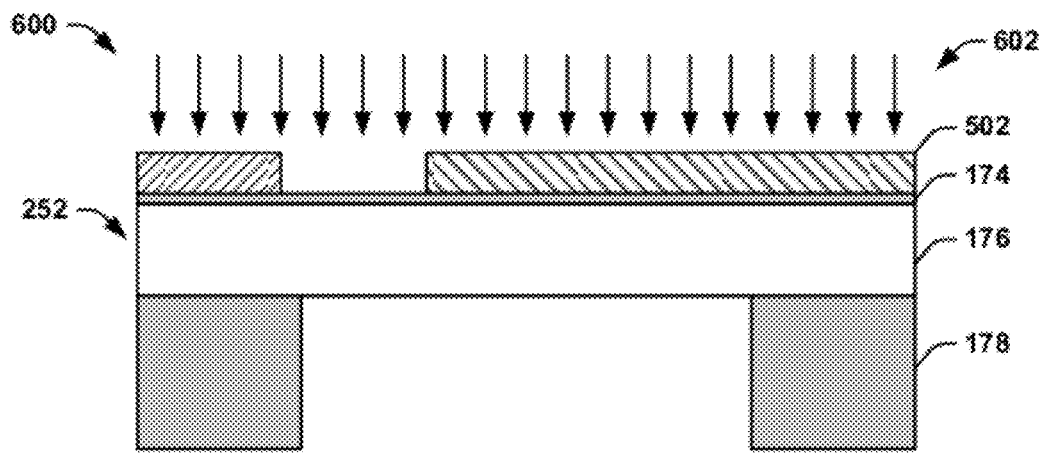
FIG. 13 illustrates an example diagram of the SOI structure of FIG. 12 undergoing a doping step.

FIG. 13 illustrates an example diagram 600 of the SOI structure 252 of FIG. 12 undergoing a doping step. The doping step can be implemented using any of a variety of doping methods, as indicated by the arrows 602. The doping step can thus be implemented to dope the first silicon layer 174 to generate the first doped region 54. As an example, the doping step can be implemented to implant an n-type dopant in the first silicon layer 174, such that the first doped region 54 is an n-doped region. The photoresist layer 502 can thus be configured to mask the remaining portions of the first silicon layer 174 from implantation of the dopant, such that the first silicon layer 174 remains intrinsic.

Figure 14:
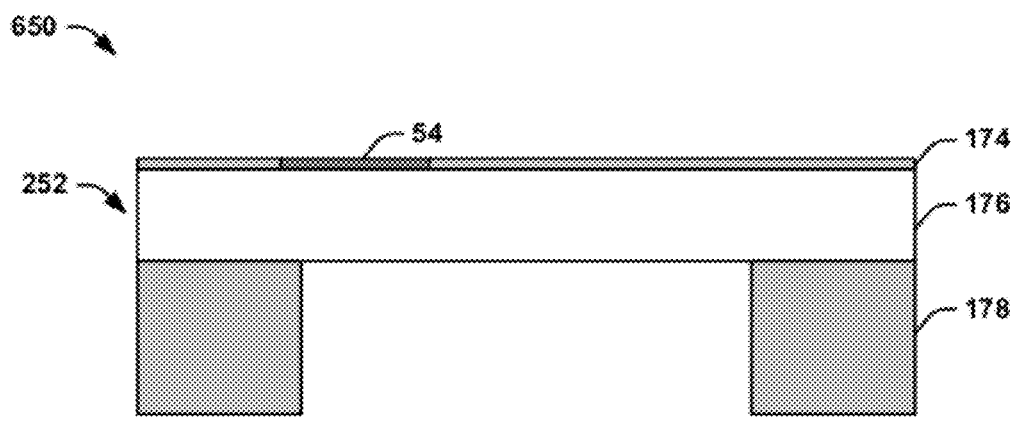
FIG. 14 illustrates an example diagram of the SOI structure of FIG. 13 after the doping step is substantially complete.

FIG. 14 illustrates an example diagram 650 of the SOI structure 252 of FIG. 13 after the doping step is substantially complete. Specifically, the diagram 650 illustrates a partially complete SOI structure 252 after a stripping step (e.g., ashing in an $O_2$ plasma) is substantially complete to remove remaining portions of the patterned photoresist layer 502. Therefore, the SOI structure 252 includes the first doped region 54 that has been generated via the doping process of the example of FIG. 13 in the first silicon layer 174.

Figure 15:
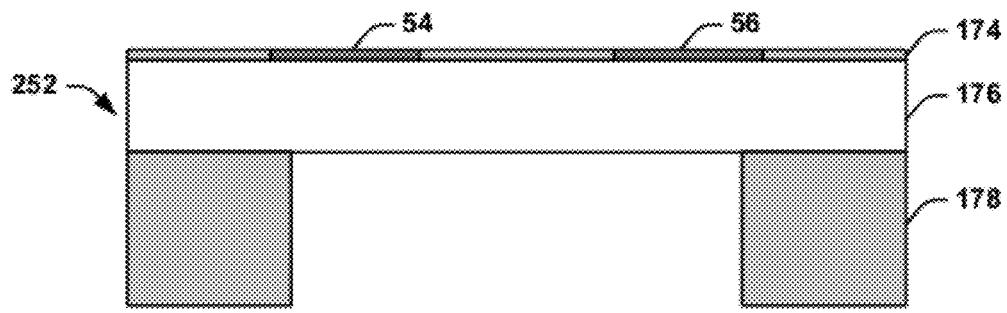
FIG. 15 illustrates an example diagram of the SOI structure of FIG. 14 after an additional doping step is substantially complete.

FIG. 15 illustrates an example diagram 700 of the SOI structure 252 of FIG. 14 after an additional doping step is substantially complete. The additional doping step can be substantially similar to the doping step described in the examples of FIGS. 11-13. As an example, a photoresist layer (not shown) can be applied to the SOI structure 252 of the example of FIG. 14, can be patterned, and a dopant can be implanted into the first silicon layer 174 to generate the second doped region 56. As an example, the additional doping step can be implemented to implant a p-type dopant in the first silicon layer 174, such that the second doped region 56 is a p-doped region. The patterned photoresist layer can thus be configured to mask the remaining portions of the first silicon layer 174 and the first doped region 54 from implantation of the p-type dopant.

Figure 16:
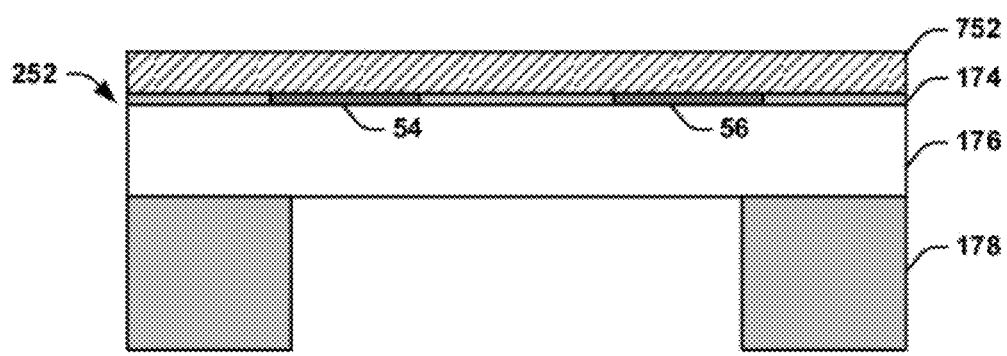
FIG. 16 illustrates an example diagram of a cross-sectional view of the SOI structure of FIG. 15 with a photoresist layer.

FIG. 16 illustrates an example diagram 750 of a cross-sectional view of the SOI structure 252 of FIG. 15 with a photoresist layer 752. The photoresist layer 752 is demonstrated as being formed on the first silicon layer 174, as well as the first and second doped regions 54 and 56. The photoresist layer 752 can have a thickness suitable for fabricating the second portion 152 (e.g., about 500 Å-5000 Å), such as based on the wavelength of radiation used to pattern the photoresist layer 752. The photoresist layer 752 may be formed over the first silicon layer 174, as well as the first and second doped regions 54 and 56, via conventional spin-coating or spin casting deposition techniques.

Figure 17:
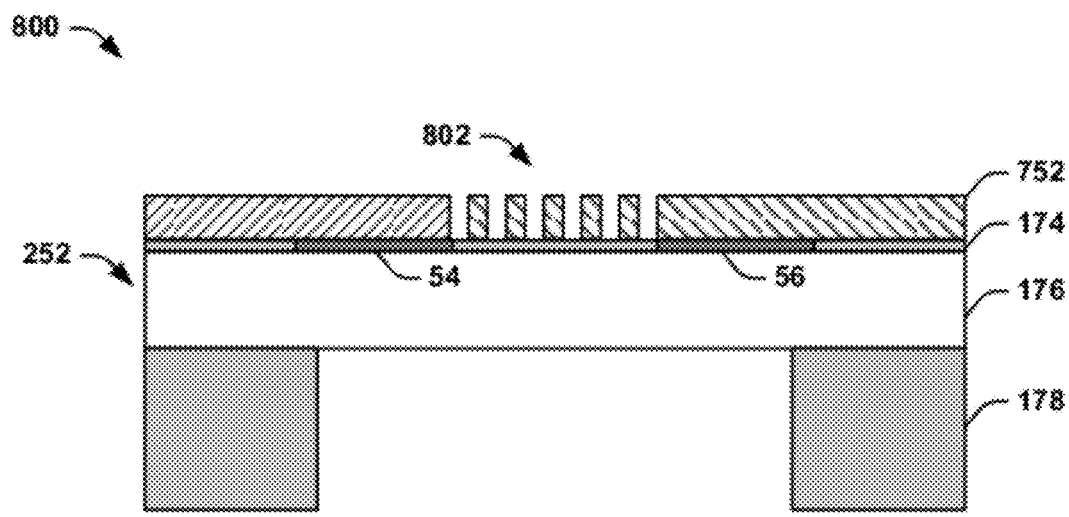
FIG. 17 illustrates an example diagram of the SOI structure of FIG. 16 with the photoresist layer having been patterned.

FIG. 17 illustrates an example diagram 800 of the SOI structure 252 of FIG. 16 with the photoresist layer 752 having been patterned. Specifically, photoresist layer 752 is patterned using conventional techniques to form a plurality of openings 802. The patterned photoresist layer 752 can thus serve as an etch mask layer for processing or etching the underlying first silicon layer 174 between the first and second doped regions 54 and 56 to form sub-wavelength etchings that act as a partially-reflective grating.

Figure 18:
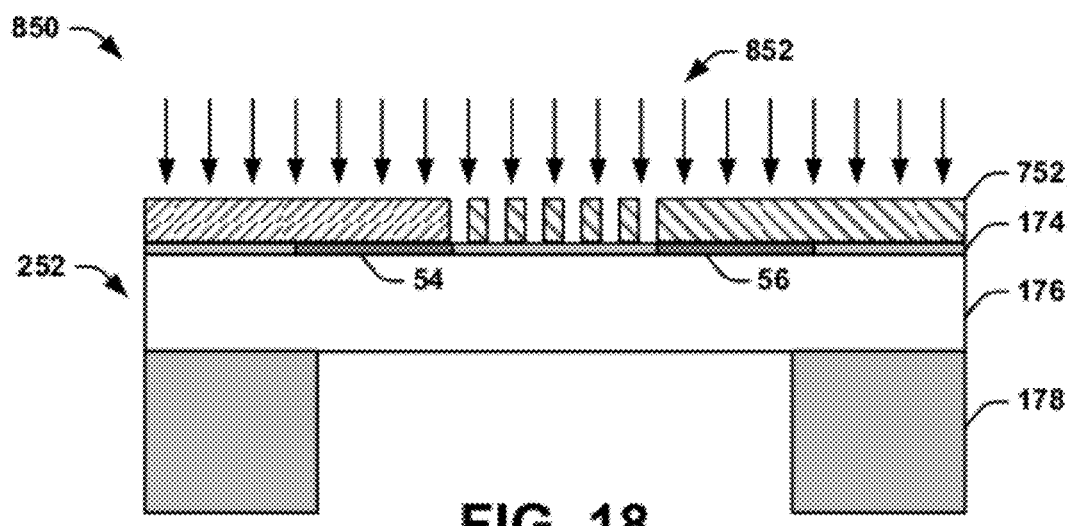
FIG. 18 illustrates an example diagram of the SOI structure of FIG. 17 undergoing an etching step.

FIG. 18 illustrates an example diagram 850 of the SOI structure 252 of FIG. 17 undergoing an etching step. The etch can be an anisotropic DRIE etch, as indicated by the arrows 852. Any suitable DRIE etch technique may be used to etch the first silicon layer 174. For example, the first silicon layer 174 can be anisotropically etched with one or more plasma gases, such as carbon tetrafluoride ($CF_4$) containing fluorine ions, in a commercially available etcher, such as a parallel plate DRIE apparatus or, alternatively, an electron cyclotron resonance (ECR) plasma reactor to replicate the mask pattern of the patterned photoresist layer 752. However, it is to be understood that other etching techniques can be implemented in the etching step described in the example of FIG. 17.

Figure 19:
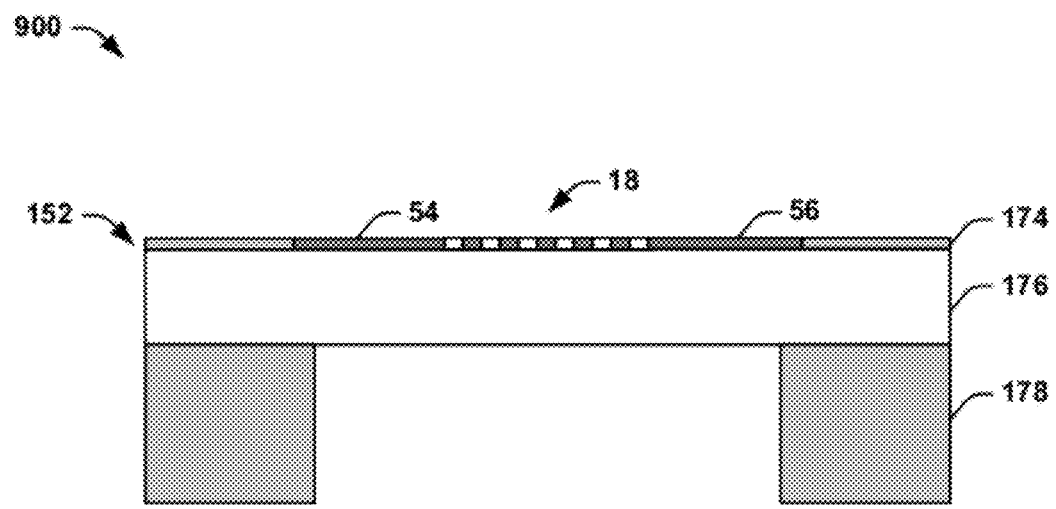
FIG. 19 illustrates an example diagram of the SOI structure of FIG. 18 after the etching step is substantially complete.

FIG. 19 illustrates an example diagram 900 of the SOI structure 252 of FIG. 18 after the etching step is substantially complete. Specifically, the diagram 900 illustrates a view of the complete second portion 152 after a stripping step is substantially complete to remove remaining portions of the patterned photoresist layer 752. Therefore, the SOI structure 252 includes an etched pattern 902 that has been etched via the DRIE etch process of the example of FIG. 17 in the first silicon layer 174 corresponding to the openings 802 that were patterned into the photoresist layer 752 (e.g., to form a grating). Thus, the etching of the openings 802 corresponds to the patterning of the HCG mirror 18 on the first silicon layer 174. As an example, the etching of the openings 802 can result in the fingers 52 of the HCG mirror 18 demonstrated in the example of FIG. 3.

Figure 20:
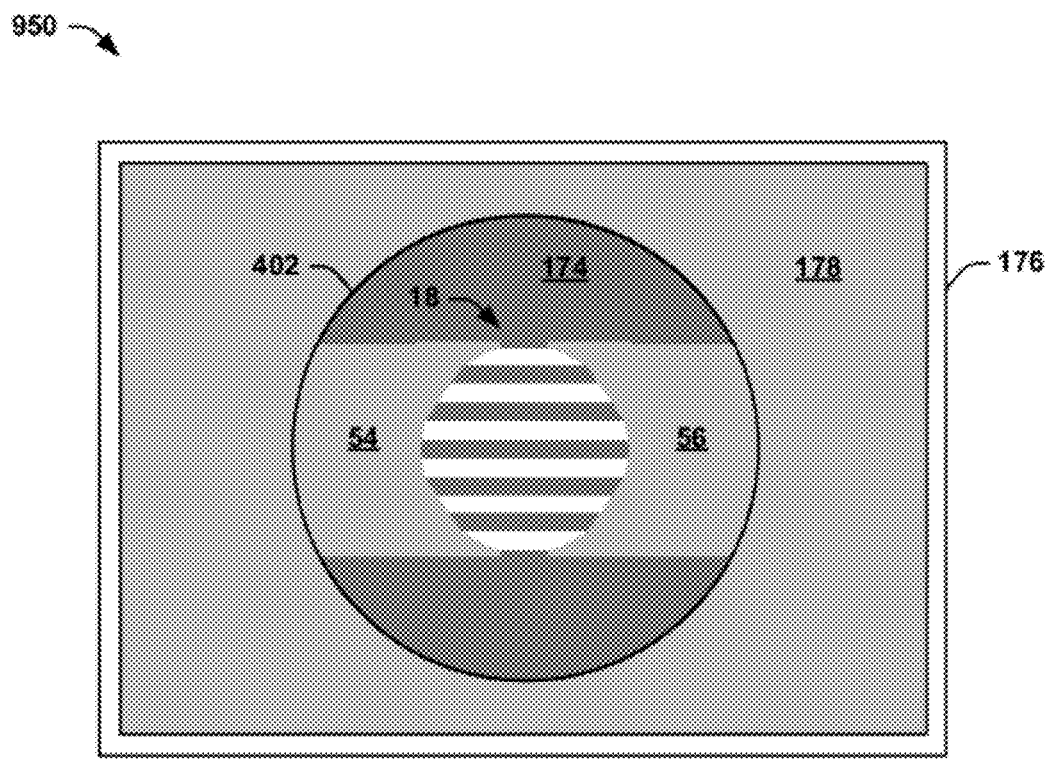
FIG. 20 illustrates an example diagram of a top view of the SOI structure of FIG. 19.

FIG. 20 illustrates an example diagram 950 of a top view of the SOI structure 252 of FIG. 19. In the example of FIG. 20, the openings 802 constituting the HCG grating 76 are demonstrated as being arranged between the first and second doped regions 54 and 56 and substantially centered with the hole 402, such that the openings 802 constituting the HCG grating 76 are substantially enclosed in a circular outer diameter that is concentric with the hole 402.

Figure 21:
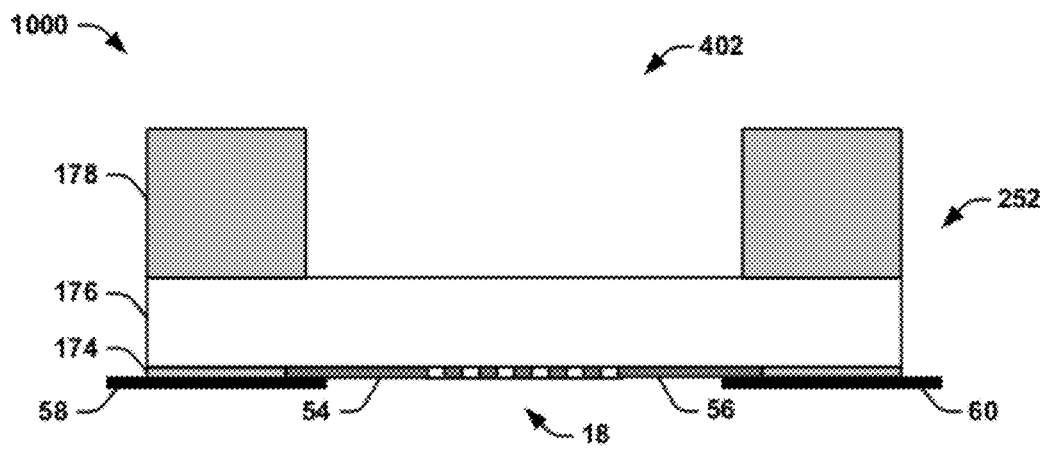
FIG. 21 illustrates an example diagram of a cross-sectional view of the SOI structure of FIG. 19 after a metallization step is substantially complete.

FIG. 21 illustrates an example diagram 1000 of a cross-sectional view of the SOI structure 252 of FIG. 19 after a metallization step is substantially complete. The metallization step can be implemented using any of a variety of methods to generate the contacts 58 and 60 coupled to the first silicon layer 174 and the first and second doping regions 78 and 80, respectively. As an example, the metallization step can be implemented via vacuum deposition or via an etching process. Thus, the SOI structure 252 of the example of FIG. 21 can correspond to the second portion 152 of the VCSEL system 50 in the example of FIG. 4.

Figure 22:
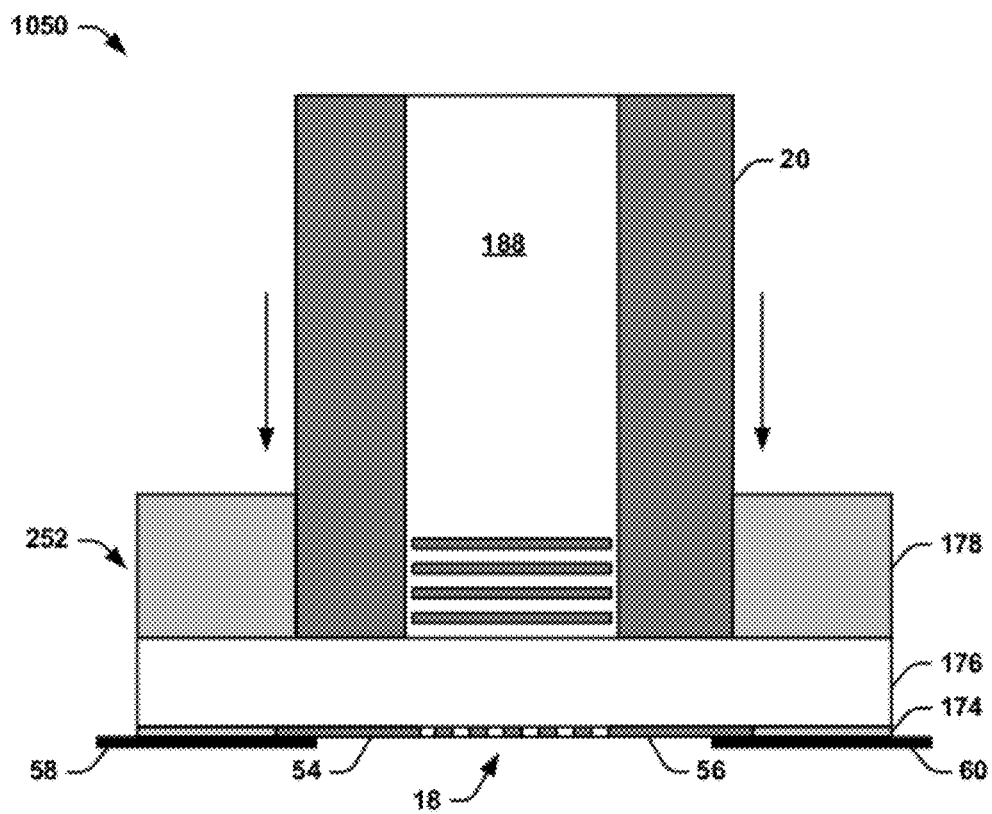
FIG. 22 illustrates an example diagram of a cross-sectional view of the SOI structure of FIG. 21 being coupled with an optical fiber.

FIG. 22 illustrates an example diagram 1050 of a cross-sectional view of the SOI structure 252 of FIG. 21 being coupled with the optical fiber 20. The optical fiber 20 is received within the hole 402, such that the OD of the optical fiber 20 is substantially flush with the ID of the hole 402. The optical fiber 20 can then be butt-coupled directly to the insulator layer 176. As a result, the single-mode core 182 is substantially aligned with the HCG mirror 18 formed by the openings 802 on the opposite surface. Accordingly, an associated supporting structure can suspend the completed second portion 152 over the first portion 151, such that the optical signal (OPT) can be resonated by the mirror 16 and the HCG mirror 18 and launched into the optical fiber 20.

Figure 23:
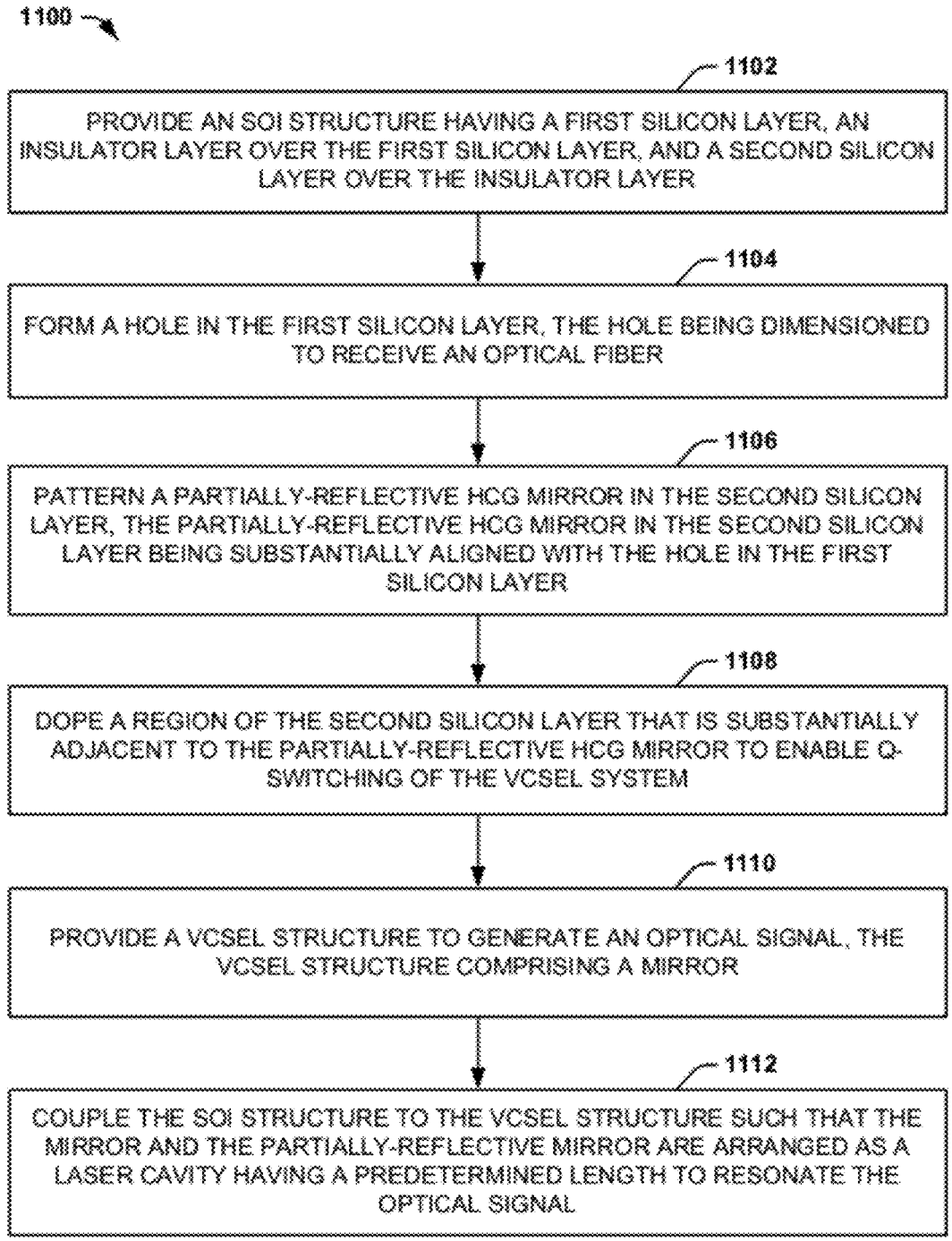
FIG. 23 illustrates an example of a method for fabricating a VCSEL system.

In view of the foregoing structural and functional features described above, an example method will be better appreciated with reference to FIG. 23. While, for purposes of simplicity of explanation, the method of FIG. 23 is shown and described as executing serially, it is to be understood and appreciated that the method is not limited by the illustrated order, as parts of the method could occur in different orders and/or concurrently from that shown and described herein.

FIG. 23 illustrates an example of a method 1100 for fabricating a VCSEL system. At 1102, an SOI structure having a first silicon layer, an insulator layer over the first silicon layer, and a second silicon layer over the insulator layer is provided. At 1104, a hole is formed in the first silicon layer, the hole being dimensioned to receive an optical fiber. At 1106, a partially-reflective high-contrast grating (HCG) mirror is patterned in the second silicon layer, the partially-reflective HCG mirror in the second silicon layer being substantially aligned with the hole in the first silicon layer. At 1108, doping a region of the second silicon layer that is substantially adjacent to the partially-reflective HCG mirror, the region to receive a voltage signal to substantially alter a reflectivity of the partially-reflective HCG mirror to enable Q-switching of the VCSEL system. At 1110, a VCSEL structure is provided to generate an optical signal, the VCSEL structure comprising a mirror. At 1112, the SOI structure is coupled to the VCSEL structure such that the mirror and the partially-reflective mirror are arranged as a laser cavity having a predetermined length to resonate the optical signal What have been described above are examples. It is, of course, not possible to describe every conceivable combination of components or methodologies, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

What is claimed is:

1. A vertical cavity surface emitting laser (VCSEL) system comprising:
    a gain region to amplify an optical signal in response to a data signal;
    a first mirror arranged as a partially-reflective high-contrast grating (HCG) mirror at an optical output of the VCSEL system;
    a second mirror, the first and second mirrors being arranged as a laser cavity to resonate the optical signal; and
    a doped semiconductor region to generate a current through the first mirror in response to a voltage signal to substantially alter the reflectivity of the first mirror to provide Q-switching capability of the VCSEL system.

2. The system of claim 1, wherein the doped semiconductor region comprises an n-doped region and a p-doped region that are interconnected by the first mirror, the voltage signal generating the current from the n-doped region to the p-doped region through the first mirror to substantially reduce the reflectivity of the first mirror.

3. The system of claim 1, further comprising:
    an optical fiber coupled to the optical output of the VCSEL system;
    a voltage source configured to generate the voltage signal; and
    a controller configured to activate and deactivate the voltage source to control Q-switching of the VCSEL system to launch pulsed optical signals into the optical fiber.

4. The system of claim 1, further comprising:
    a first wafer comprising the gain region and the second mirror; and
    a second wafer comprising the first mirror to couple the optical signal to an optical fiber.

5. The system of claim 4, wherein the second wafer is a silicon-on-insulator (SOI) wafer comprising a first silicon layer, an insulator layer over the first silicon layer, and a second silicon layer over the insulator layer.

6. The system of claim 4, wherein the first wafer comprises an aperture through which the optical signal resonates between the first and second mirrors, the first mirror focusing the optical signal through the aperture.

7. The system of claim 4, wherein the second wafer comprises a hole etched in a silicon layer on a first surface of the second wafer, the hole being substantially aligned with the first mirror on a second surface of the second wafer opposite the first surface.

8. The system of claim 7, wherein the hole receives the optical fiber, such that the optical fiber is substantially aligned with the second mirror.

9. A method for fabricating a vertical cavity surface emitting laser (VCSEL) system, the method comprising:
    providing a silicon-on-insulator (SOI) structure having a first silicon layer, an insulator layer over the first silicon layer, and a second silicon layer over the insulator layer;
    forming a hole in the first silicon layer, the hole being dimensioned to receive an optical fiber subsequent to fabrication;
    patterning a partially-reflective high-contrast grating (HCG) mirror in the second silicon layer, the partially-reflective HCG mirror in the second silicon layer being substantially aligned with the hole in the first silicon layer;
    doping a region of the second silicon layer that is substantially adjacent to the partially-reflective HCG mirror, the region to receive a voltage signal to substantially alter a reflectivity of the partially-reflective HCG mirror to enable Q-switching of the VCSEL system;

providing a VCSEL structure that amplifies an optical signal, the VCSEL structure comprising a mirror; and coupling the SOI structure to the VCSEL structure such that the mirror and the partially-reflective HCG mirror are arranged as a laser cavity having a predetermined length to resonate the optical signal.

10. The method of claim 9, wherein forming the hole in the first silicon layer comprises:

patterning a photoresist material to form a mask for the hole; and performing a reactive-ion etch to form the hole in the first silicon layer.

11. The method of claim 9, wherein patterning the partially-reflective HCG mirror in the second silicon layer comprises:

patterning a photoresist material to form a mask for the partially-reflective HCG mirror; and performing a reactive-ion etch to form the partially-reflective HCG mirror in the second silicon layer.

12. The method of claim 9, wherein patterning the partially-reflective HCG mirror in the second silicon layer comprises patterning the partially-reflective HCG mirror to comprise a plurality of fingers to conduct a current in response to the voltage signal to enable the Q-switching of the VCSEL system.

13. The method of claim 9, doping the region of the second silicon layer comprises:

doping a first region that is substantially adjacent to the partially-reflective HCG mirror with an n-type dopant; and doping a second region that is substantially adjacent to the partially-reflective HCG mirror and substantially opposite the first region with a p-type dopant, such that the voltage signal generates a current from the first region to the second region through the partially-reflective HCG mirror.

14. The method of claim 9, wherein providing the VCSEL structure comprises providing the VCSEL structure having an aperture in an oxide layer through which the partially-reflective HCG mirror focuses the optical signal to resonate the optical signal between the mirror and the partially-reflective HCG mirror.

15. The method of claim 9, wherein forming the hole in the first silicon layer comprises forming the hole to have an inner diameter (ID) that is approximately equal to an outer diameter (OD) of the optical fiber, such that the optical fiber is substantially aligned with the partially-reflective HCG mirror upon being received in the hole in the first silicon layer.

16. A method to control Q-switching of a vertical cavity surface emitting laser (VCSEL) system, the method comprising:

applying a data signal to a gain region of the VCSEL to amplify an optical signal that resonates in an optical cavity defined by a partially-reflective high-contrast grating (HCG) mirror and another mirror;

activating a voltage source to generate a current across the HCG mirror of the VCSEL to change a reflectivity associated with the HCG mirror to provide the optical signal as an optical signal pulse through the HCG mirror; and deactivating the voltage source.

17. The method of claim 16, wherein the activating and deactivating is executed between picosecond and nanosecond timeframes.

18. The method of claim 16, wherein the generated current is sufficient to reduce the reflectivity of the HCG by approximately 10%.

19. The system of claim 1, wherein the duration of the voltage signal is between picosecond and nanosecond timeframes.

20. The system of claim 1, wherein the current through the first mirror alters the reflectivity of the first mirror by approximately 10%.

* * * * *